(12) United States Patent
Penzes

(10) Patent No.: US 8,541,880 B2
(45) Date of Patent: Sep. 24, 2013

(54) METHOD AND SYSTEM TO REDUCE AREA OF STANDARD CELLS

(75) Inventor: Paul Penzes, Newport Beach, CA (US)

(73) Assignee: Broadcom Corporation, Irvine, CA (US)

( * ) Notice: Subject to any disclaimer, the term of this patent is extended or adjusted under 35 U.S.C. 154(b) by 575 days.

(21) Appl. No.: 12/650,836

(22) Filed: Dec. 31, 2009

(65) Prior Publication Data

US 2011/0156103 A1     Jun. 30, 2011

(51) Int. Cl.
*H01L 29/40*     (2006.01)

(52) U.S. Cl.
USPC .... 257/774; 257/211; 257/773; 257/E27.046; 257/E23.141

(58) Field of Classification Search
USPC ........... 257/211, 773, 774, E23.141, E27.046
See application file for complete search history.

(56) References Cited

U.S. PATENT DOCUMENTS

| 5,534,711 | A | * | 7/1996 | Ovshinsky et al. | ............... | 257/3 |
| 2006/0157680 | A1 | * | 7/2006 | Takaura et al. | ................... | 257/3 |

* cited by examiner

*Primary Examiner* — Minchul Yang
(74) *Attorney, Agent, or Firm* — Sterne, Kessler, Goldstein & Fox P.L.L.C.

(57) ABSTRACT

A signal routing grid. A first metal layer has wires running in a first direction. A second metal layer, spaced from and substantially parallel to the first metal layer, has wires running in a second direction different to the first direction, such that the wires of the first and second metal layers appear from above or below to form virtual intersections. Vias or contacts are coupled between the first and second metal layers and configured to route signals between the first and second metal layers. Pins are coupled to the first metal layer and configured to provide input signals or receive output signals from a standard cell, the pins being positioned along the wires in the first metal layer so as to be spaced from the virtual intersections.

20 Claims, 9 Drawing Sheets

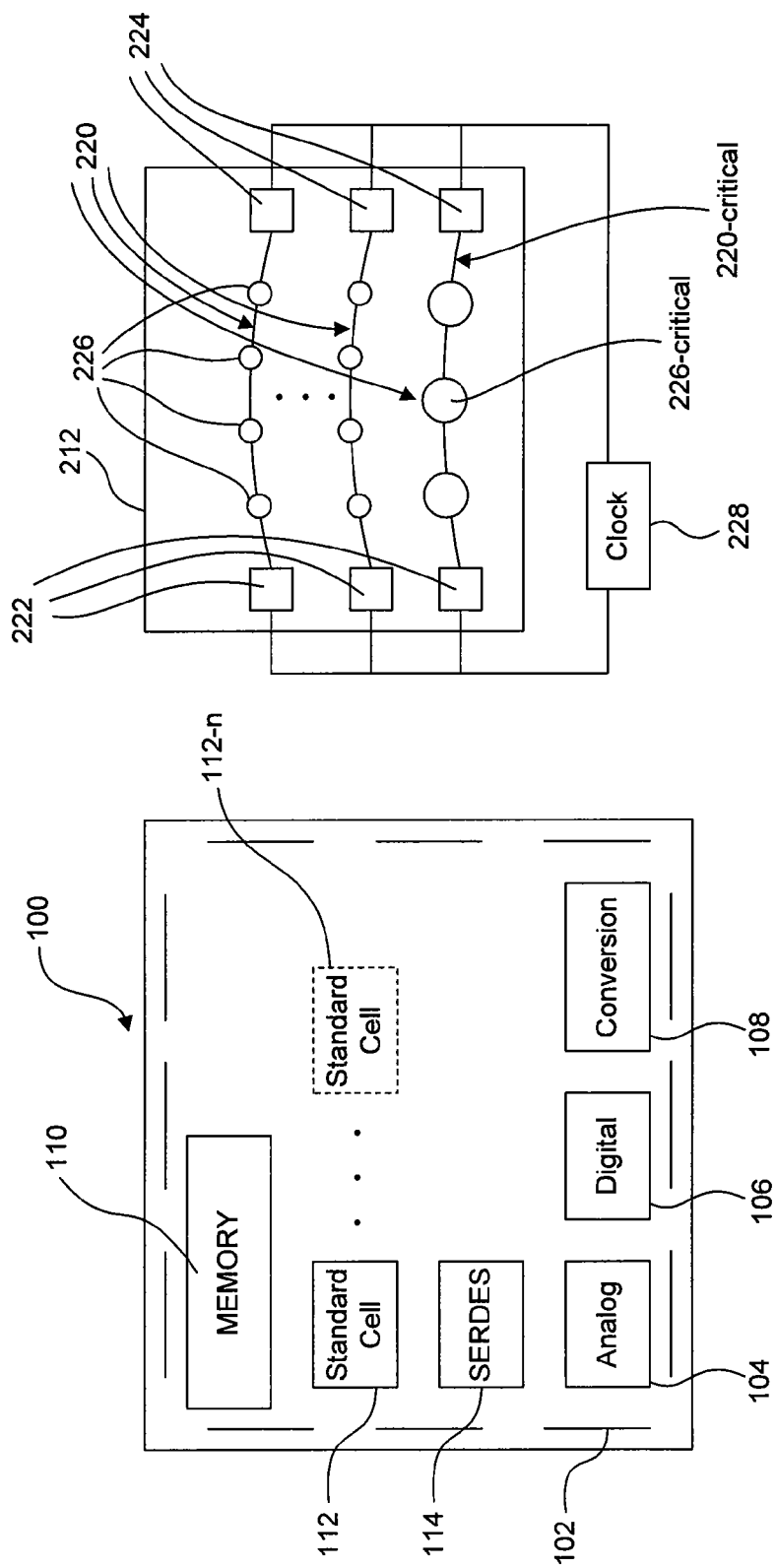

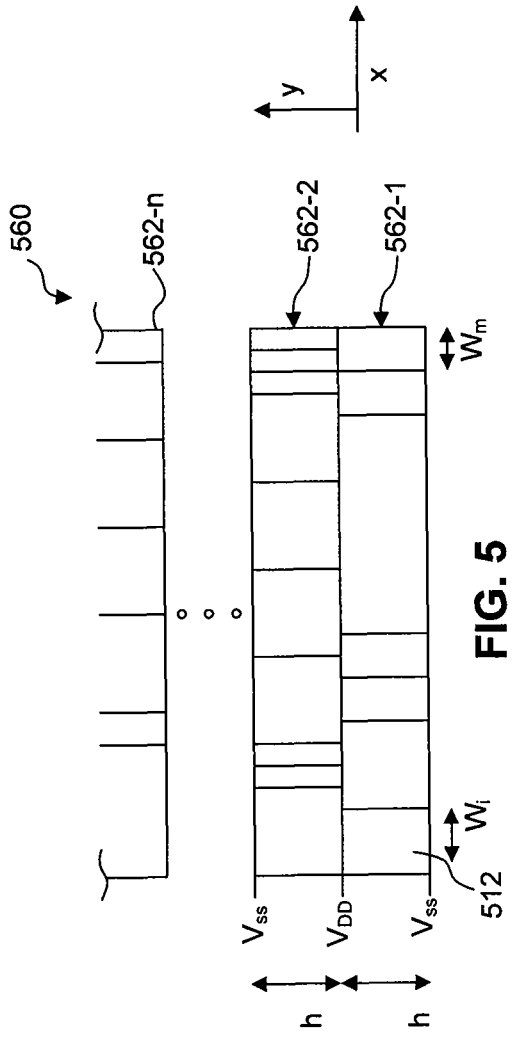
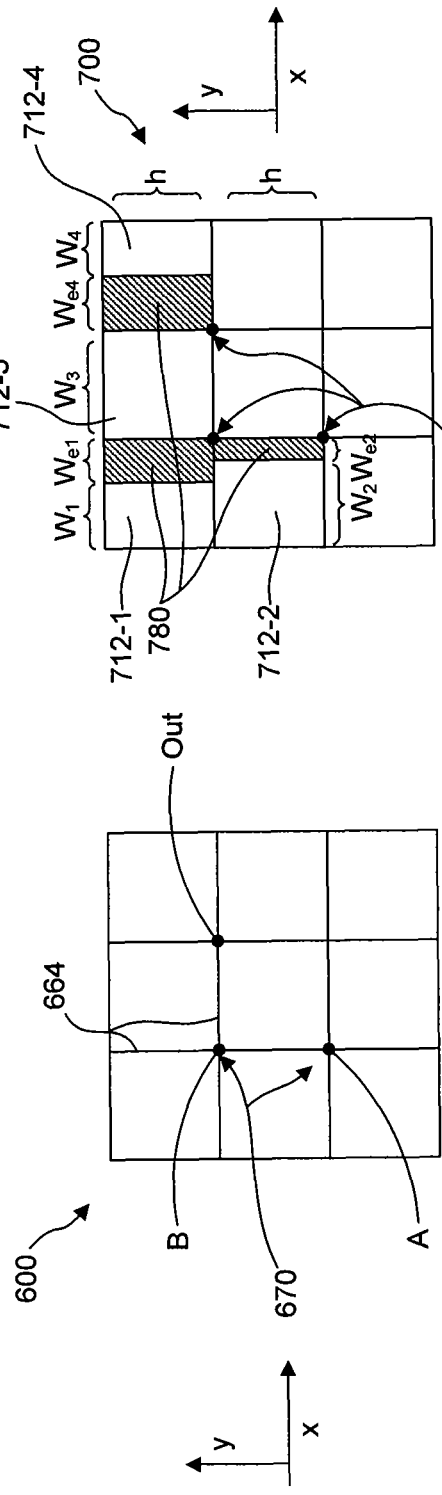
FIG. 5
FIG. 6
FIG. 7

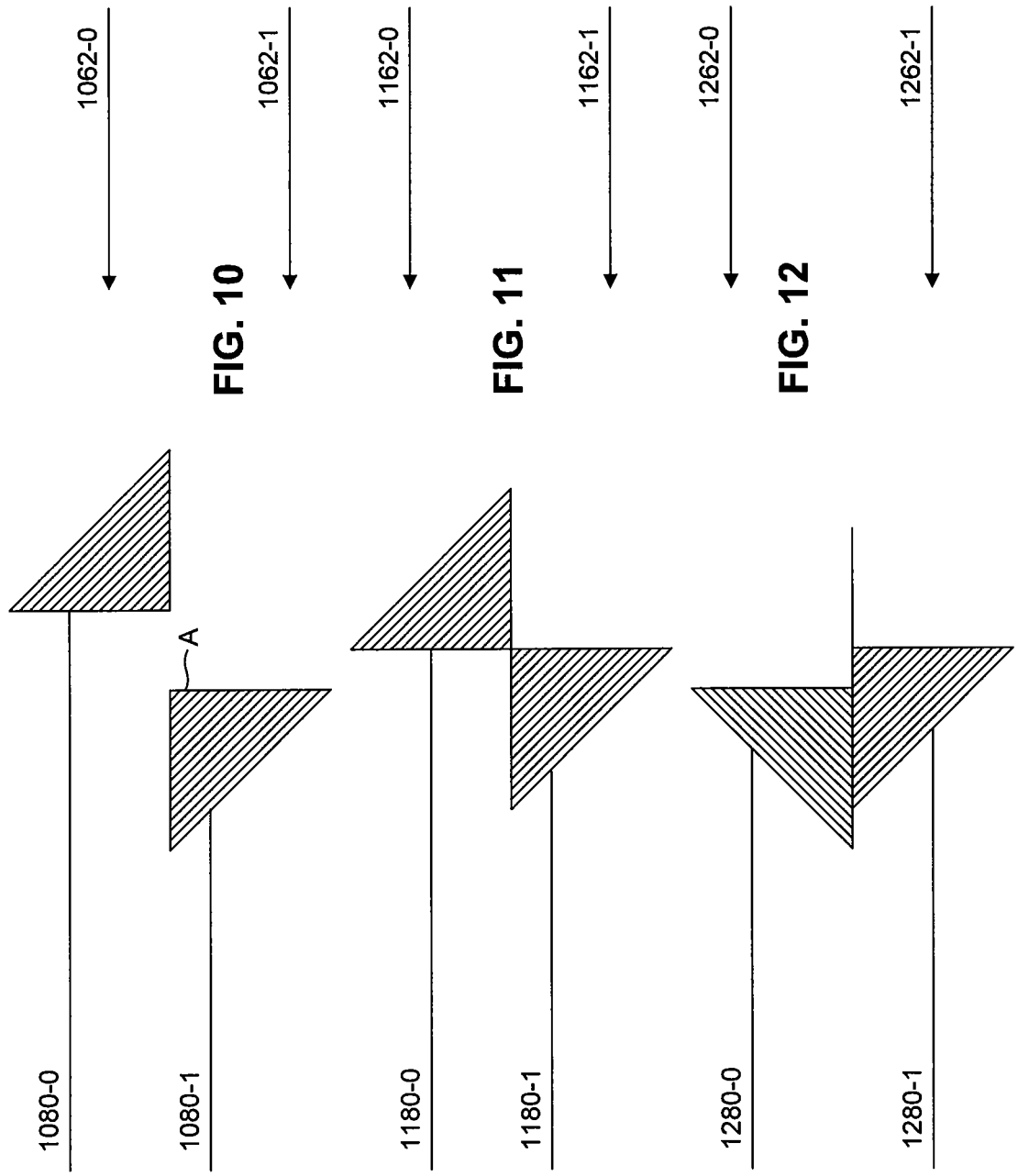

METHOD AND SYSTEM TO REDUCE AREA OF STANDARD CELLS

BRIEF DESCRIPTION OF THE DRAWINGS/FIGURES

FIG. 1 shows an integrated circuit (IC) or chip, according to an embodiment of the present invention.

FIG. 2 shows a standard cell of an IC or a chip, according to an embodiment of the present invention.

FIG. 5 shows a portion of a chip including a plurality of standard cells.

FIG. 6 shows a signal distribution grid.

FIG. 7 shows a signal distribution grid overlapping several standard cells.

FIGS. 10-12 show various configurations of relationships between extension regions of standard cells in adjacent rows.

Figure 3:
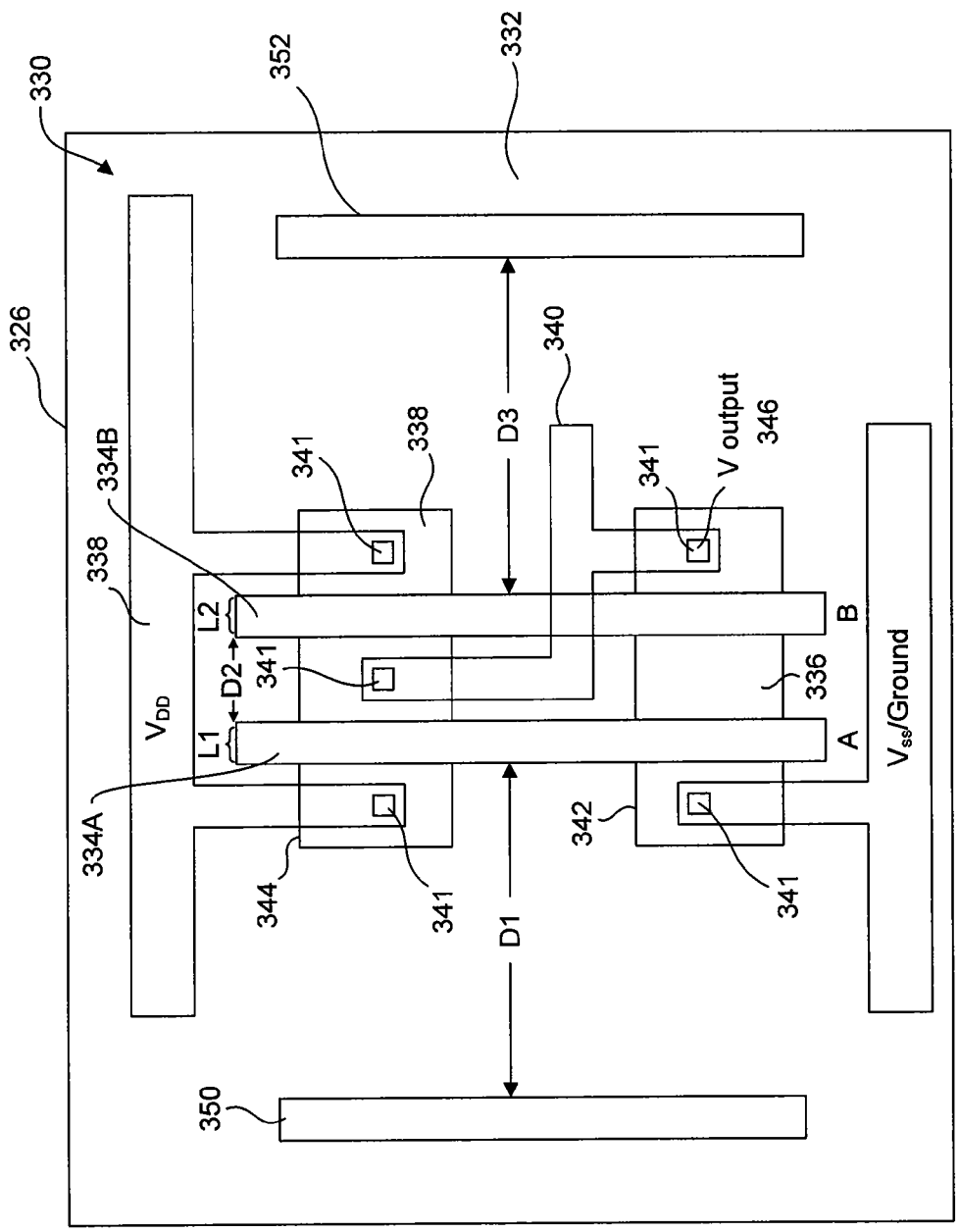
FIG. 3 shows a NAND gate in a standard cell of an IC or a chip, according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

The present invention is directed to a hybrid standard cell library using larger standard cells in a critical path and smaller standard cells in non-critical paths. This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

An embodiment of the present invention provides a system comprising signal paths. There are first through n signal paths, n being a positive integer. A critical one of the first through n signal paths is based on being a respective one of the first through n signal paths having a slowest signal propagation and/or a path in which a signal propagates slower than a clock cycle. The critical one of the first through n signal paths includes logic devices that correspond to a first size of a standard cell. The non-critical ones of the first through n signal paths include logic devices that correspond to a second size of a standard cell, the second size being smaller than the first size.

Another embodiment of the present invention includes incorporating the system above as a standard cell of a chip or integrated circuit. The chip may also include one or more of pads, an analog portion, a digital portion, a memory, a conversion portion, and a serial-deserializer.

A further embodiment of the present invention provides a method used to produce a hybrid standard cell library. A critical signal path is determined in a plurality of signal paths, the critical path being one in which a signal propagates slowest and/or a path in which a signal propagates slower than a clock cycle. A first sized standard cell and corresponding logic devices are used along the critical signal path. A second sized standard cell and corresponding logic devices are used along remaining ones of the plurality of signal paths, the second size being smaller than the first size.

In additional or alternative embodiments, additional paths having a propagation speed below a threshold amount can be considered quasi-critical paths, and can include the larger sized standard cell.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

FIG. 1 shows an integrated circuit (IC) or chip 100. In one example, chip 100 can include one or more of pads 102, an analog portion 104, a digital portion 106, a conversion portion 108 (e.g., analog-to-digital and/or digital-to-analog conversions), a memory 110, and one or more standard cells 112-112*n*. Optionally, chip 100 can include a SERDES portion 114, which is a serial-deserializer device that converts input serial data to deserialized parallel data for use by the other portions of chip 100.

In one example, elements 102-114 can be proprietary or manufacturer specific, with the normal exception of standard cell(s) 112. Standard cell 112 can vary in size based on a size and/or number of devices thereon, e.g., a size of logic devices (sometimes referred to as gates, and used interchangeably below) thereon or a number of logic devices thereon, to provide an optimal combination of size, signal propagation speed, leakage, etc, or a combination thereof. For example, each standard cell 112 is designed to perform a specific function or set of functions or processes on a propagating signal. These functions are represented by combination of transistors forming various logic gates, as discussed in more detail below.

Typically, designing an integrated circuit or chip 100 includes several steps. Specifying the functionality of the chip in a standard hardware programming language (e.g., verilog). Synthesizing/mapping the circuit description into basic gates of a Standard Cell Library, e.g., using CAD tools like DesignCompiler® sold by Synopsys® of Mountain View, Calif. Placing and routing the gate netlist using CAD tools like BlastFusion sold by Magma™ of San Diego, Calif. Verifying proper connectivity and functionality of the circuit. It is to be appreciated alternative or additional steps may also occur. However, traditionally, the most important aspect of the design process, and most proprietary, is development of tools in a Standard Cell Library. As briefly discussed above, the Standard Cell Library comprises a set of standard cells, each standard cell having various arrangements of devices (e.g., logic devices comprising transistors) thereon to perform desired functions.

Currently, designers use several techniques to increase a speed of signal propagation in a chip.

Stress or strained engineering can be used to increase mobility of electron flow in transistors, such as stress engineering used by foundries. A detailed explanation of this technology is not provided herein for brevity, as stress or strain engineering is well known to a skilled artisan. For example, if the devices are transistors, deep submicron fabrication techniques can be used. Using deep submicron fabrication/doping techniques increases mobility or current flow between transistors of a logic device. For example, there can be about a 10-20% increase in mobility for N-transistors and about a 10-20% increase in mobility for P-transistors.

An alternate way to provide increased speed for standard cells is to duplicate and connect several transistors in parallel. While this method yields an increase in the drain saturation current proportional to the number of transistor duplications, it also increases the input capacitance proportionally. That increased input capacitance will have to be charged/discharged by the standard cell, which could actually result in a reduction in signal propagation speed.

Technology scaling allows for higher and higher levels of integration through shrinking of individual device sizes. According to Moore's Law, chips should double their signal propagation speed every 18 months. While this "law" has been applicable for more than 20 years, mere process scaling may no longer deliver the expected or required speed increases. This can be due to the fact certain device parameters have reached atomic scales. One of the consequences of this speed saturation due to technology scaling is that at each stage of the design process, discussed above, it has become more difficult to provide incremental increases in circuit performance. Even small speed improvements can require substantial design efforts. Therefore, as discussed above, having a robust and effective Standard Cell Library is critical to future increases in chip performance.

Thus, what is needed is a hybrid configuration of a standard cell, or a plurality of standard cells, of a chip that benefits from stress or strain engineering for a set of devices on standard cell without requiring a large increase in size and/or power consumption of an entire chip.

FIG. 2 shows a standard cell block 212, according to an embodiment of the present invention. Standard cell block 212 can include one or more paths 220.

In one example, each end of a path 220 includes a corresponding first (starting) register 222 and second (ending) register 224. In one example, each path 220 includes one or more devices 226, e.g., logic devices, between corresponding first and second registers 222 and 224. In one example, logic devices 226 can be transistor-based logic devices that implement desired functions, e.g., NAND/NOR gates, inverters, flip-flops, or the like. For example, logic devices 226 can be used to perform one or more processes (i.e., implement one or more functions) on a propagating signal along each path 220 as the signal propagates from being stored in first register 222 to being stored in second register 224.

In one example, each register 222 and 224 is coupled to a clock 228 that produces a clock signal setting a clock cycle. For example, at a first edge of a clock cycle a signal is transmitted from first register 222 along path 220 to be processed by one or more logic devices 226. At a second edge of the clock signal, the processed signal is received by second register 224. It is desired that all signals are completely processed within the duration of the clock signal so that they reach the second register 224 at the second edge of the clock signal.

It is to be appreciated that in one example each path 220 may have a different propagation time based on the type of functions that are performed, a number of transistors or other similar components, or other characteristics of each device 226, etc. In one example, one of the paths 220 has a slowest propagation time between first and second registers 222 and 224. The path 220 with the slowest propagation time is considered a critical path 220-critical. The critical path can be the path that needs the most increase in speed to ensure the propagating signal is received at second register 224 within the clock cycle.

It is also to be appreciated one or more other paths 220 may have propagation speeds below a threshold value, e.g., quasi-critical paths. In the quasi-critical paths, the threshold value may be the value needed to ensure the signals are received by second register 224 for that path 220 within the clock cycle duration.

In one example, the critical path, e.g., path 220-critical, includes logic devices 226-critical that have a first size and non-critical paths 220 have devices 226 that have a second size. In this example, the first size is bigger than the second size. For example, the first size can be based on using devices 226-critical that are "stretched" stress or strain engineered devices, while the second sized devices are traditional stress or strain devices, as discussed in more detail below. In one example, a stress or strain engineered device can be made larger or "stretched" to further increase mobility beyond that produced by stress or strain engineering. Stretching can be done by increasing the spacing between polysilicon strips of the device, which is discussed in more detail below. However, making each device larger across an entire standard cell can undesirably increase an overall size of each standard cell and the energy consumed by each standard cell, and thus the entire chip. For example, obtaining an approximate 10-20% increase in speed using a stretched device may result in approximately a 30-40% increase in size and approximately a 20-30% increase in leakage for chip. Also, due to the larger spacing of transistors, internal source/drain capacitance and internal wiring capacitance increases, which may actually degrade the speed gains. Thus, at the chip level only about an 8% increase in signal speed through the chip may result from the above size and leakage increases, which may be unacceptable for certain designs, especially given the increase in chip size.

Thus, in the example shown in FIG. 2, each standard cell block 212 has a hybrid combination of larger or stretched 226-critical devices and small devices 226. The hybrid combination is optimally chosen and arranged to increase signal propagation without requiring standard cell block 212 to become as large as would be required if only large sized devices 226-critical were used.

In summary, through using larger logic devices 226-critical in critical path 220-critical, propagation time is decreased. Decreasing propagation time in critical path 220-critical increases an overall speed of standard cell block 212. Further, by choosing a sub-set of paths 220 to be critical paths 220-critical (or quasi-critical paths), which limits the number of the larger sized logic devices 226-critical, and by using smaller logic devices 226 in all other non-critical paths 220, an overall standard cell block 212 size is reduced, while increasing overall chip speed. Also, by using fewer large sized devices 226-critical overall in standard cell block 212, power consumption, leakage, and other known parameters are optimized.

For example, by using the hybrid configuration described herein, the overall chip speed for a chip 100 can be increased by approximately 7-10% (e.g., from about 1283 MHz to about 1388 MHz), at the cost of an approximate 2-4% increase in total chip size. This size increase of 2-4% of chip 100 through using a hybrid combination of devices 226 is substantially less than the approximately 30% or more increase in size and/or power consumption that would be seen if only traditional stress engineered transistors were stretched for all paths 220 in all standard cells 212 on a chip 100 to obtain a similar result of an 8% increase in speed.

FIG. 3 shows a device 326, according to an embodiment of the present invention. For example, device 326 can be a NAND gate including CMOS transistors. In one example, the CMOS transistors can be manufactured using stress or strain engineering. As can be appreciated upon reading and understanding this description, many other types of devices or gates can be implemented using the embodiments described herein.

This example shows a NAND gate 326 drawn as a physical representation as it would be manufactured. NAND gate 326 is essentially parallel-connected first and second PMOS devices coupled to first and second series connected NMOS devices, as is known in the art. A circuit 330 is constructed on a P-type substrate 332. Polysilicon strips 334A, 334B, 350 and 352, diffusion areas 336 and 338, and an n-well (not shown) are referred to as "base layers," which can be inserted into trenches of P-type substrate 332. Contacts 341 penetrate an insulating layer (not shown) between the base layers and a first layer of metal 340 making a connection to the transistors.

In the example shown, inputs A and B to NAND gate 326 are via polysilicon strips 334A and 334B. The CMOS transistors (devices) are formed by the intersection of the polysilicon strips 334A and 334B and diffusion areas 336 and 338, e.g., N diffusion 336 for the N device 342 and P diffusion 338 for the P device 344. Output 346 is at a node based on coupling N and P type devices 342 and 344 via metal 340. Connections between metal and polysilicon or diffusion are made through contacts 341. N device 342 is manufactured on a P-type substrate 332. P device 344 is manufactured in an N-type well (n-well) on substrate 332. P-type device 344 is connected to Vdd and an N-type device 342 is connected to Vss (or ground) to prevent latchup.

In one example, "dummy" polysilicon strips 350 and 352, dummy since they do not serve an electrical function, are formed to emulate another transistor being proximate NAND gate 326. Adding polysilicon strips 350 and 352 can allow for secondary effects that increase transistor speed when there is another proximate transistor. Thus, by adding the additional "dummy" polysilicon strips 350 and 352 makes the functioning transistors think there is another transistor nearby to allow for optimal performance.

In one example, a distance D1 is maintained between polysilicon strips 350 and 334A, a distance D2 between polysilicon strips 334A and 334B, and distance D3 between polysilicon strips 334B and 352. Although not drawn to scale, D1, D2, and D3 may be substantially the same value. Also, in one example, predetermined gate lengths L, i.e., L1 and L2 for respective polysilicon strips 334A and 334B can be maintained to have a substantially similar desired length, L.

Referring back to FIG. 2, and with continuing reference to FIG. 3, for an example of a small logic device 226 in a non critical path 220, where $L1=L2=L$ and $D1=D2=D3=D$, the parameters for device 326 could each be substantially $L+D=0.04\ \mu m+0.14\ \mu m=0.18\ \mu m$ in 40 nm devices. Also, an example of a large logic device 226-critical in a critical path 220-critical, where $L1=L2=L$ and $D1=D2=D3=D$, the distance between polysilicon strips 350, 334A, 334B, and 352 for device 326 could be substantially $L+D=0.04\ \mu m+0.20\ \mu m=0.24\ \mu m$. This increase in D1, D2, and D3, i.e., 0.14 μm to 0.20 μm can be based, for example, on stretching a stress or strain engineered device to increase a space between transistors, which further increases mobility of current flow beyond the increase resulting from using the stress or strain engineered device, as discussed above.

In one example, the quasi-critical devices could be equal in size to the critical devices 226-critical.

In one example, having both kinds of standard cells, hybrid and traditional, in the Standard Cell Library can be used to mitigate the increased area/leakage to continue meeting Moore's law. In this example, a fraction of the standard cell encompassed by critical paths is small. Thus, through using a mix of hybrid and traditional standard cells, or even using all hybrid standard cells, the overall area requirements becomes negligible with respect to the speed increase. For example, when critical paths comprise 10-15% of a total area of a standard cell, a net area increase from using the hybrid scheme can be about 0.9+0.1*1.25=1.025 or 2.5% increase. This small area increase of 2.5% is negligible compared to the 20-30% increase if all larger devices are used to achieve the 7-10% added speed.

Figure 4:
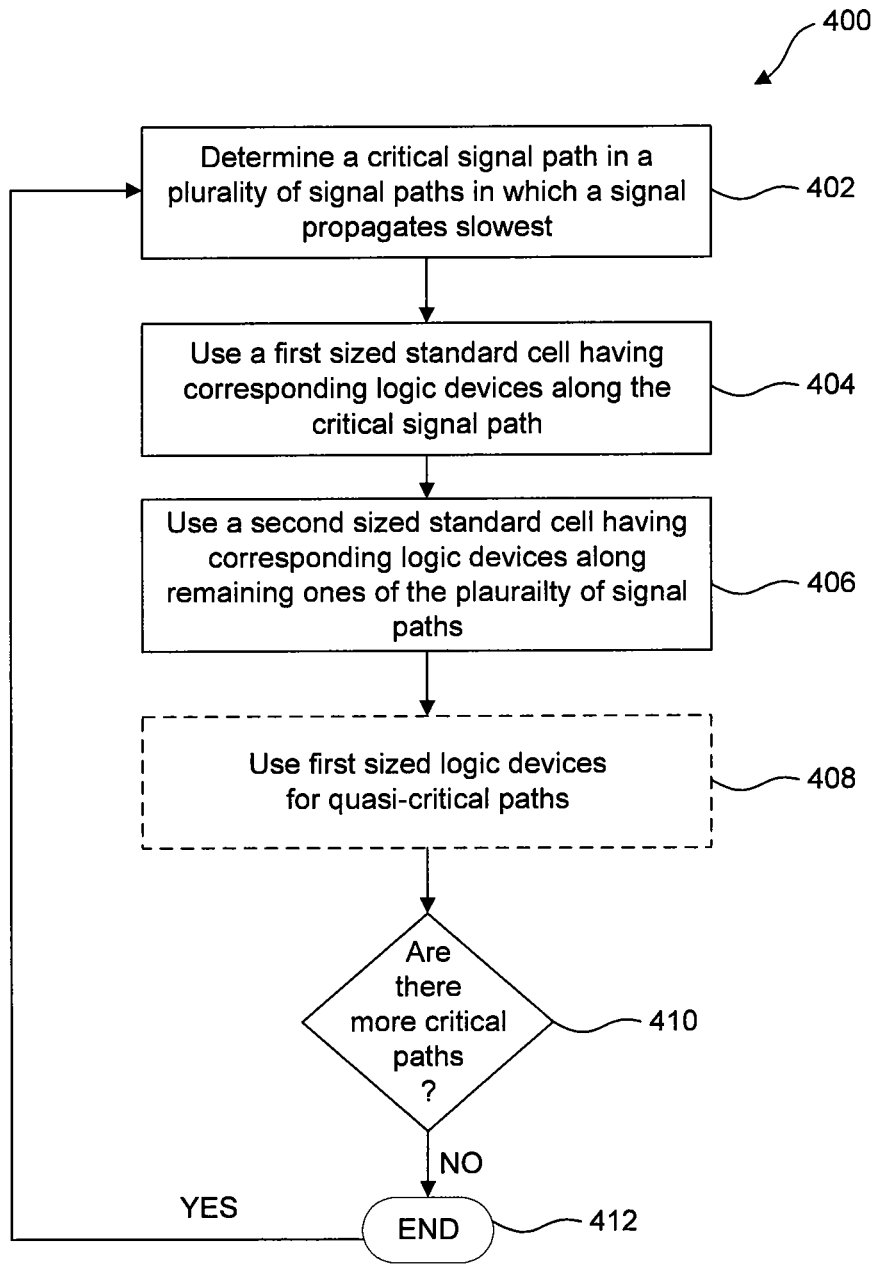
FIG. 4 shows a flowchart depicting a method, according to an embodiment of the present invention.

FIG. 4 shows a flowchart depicting a method 400, according to an embodiment of the present invention. For example, method 400 can be used to produce a hybrid standard cell library, as discussed above. In step 402, a critical signal path is determined in a plurality of signal paths, the critical signal path being one in which has the slowest signal propagation and/or a path in which a signal propagates slower than a clock cycle. In step 404, a first sized standard cell includes corresponding logic devices along the critical signal path. In step 406, a second sized standard cell includes corresponding logic devices along remaining ones of the plurality of signal paths, the second size being smaller than the first size. In additional or alternative processes, in optional step 408, additional paths having propagation speeds below a threshold amount can be considered quasi-critical paths, and can include the first sized logic devices.

Additionally, or alternatively, in an optional embodiment, either after step 406 or 408, at step 410 a determination is made whether additional critical paths exist. If yes, method 400 returns to step 402. If no, method 400 ends at step 412. The determination of step 410 can be based on whether a threshold speed or threshold speed increase has been achieved through changing the previously changed critical path. As each critical path is changed, another path may become critical until an overall speed threshold is achieved FIG. 5 shows a portion 560 of a chip including a plurality of standard cells 512. Portion 560 includes rows 562-1, 562-2, . . . 562-n (n being a positive integer), where each row 562 includes one or more standard cells 512. It is to be appreciated that any number of rows 562 can be used and any number of standard cells 512 can be in each row 562.

In the example shown, each standard cell 512 has a same height "h", but varying widths "w", e.g., $w_1, \ldots, w_m$. In other words, each standard cell 512 can have a same Y-axis value, but varying X-axis values. Just as each device, e.g., device 326 in FIG. 3, is coupled between Vdd and Vss, each standard cell 512 in each row 562 is coupled between Vdd and Vss. In the example shown, every other row 562 is "inverted" so that the proper P or N type device is coupled to its corresponding power source, Vdd or Vss.

As was discussed above, each standard cell 512 can vary in size based on an assigned functionality. For example, if a standard cell 512 performs very complex processes or functions, more transistors and/or other signal processing devices may be needed. As can be appreciated, in one example an increase in a number of devices on a standard cell 512 increases a size of a standard cell 512 regardless of a size of each individual device. Similarly, less complex functionality for a standard cell 512 usually reduces a number of transistors or other signal processing devices, which allows for a smaller standard cell 512.

As discussed above, in the example shown in FIG. 5, standard cells 512 have a same height, h, or Y value, but varying widths, $w_1$ to $w_m$, or X values. In this example, height, h, remains substantially the same because a height is application specific, and can be consistent across all standard cells 512. However, a width, w, is based on the vertical orientation of transistors or other devices on standard cell 512. Thus, the more transistors or other devices being utilized on standard cell 512, the wider standard cell 512 becomes to accommodate them.

FIG. 6 shows a signal distribution grid map or frame 600, which can be used to determine a grid that provides signals to and receive signals from one or more standard cells (not shown, but see FIG. 7). Initially, map 600 is used to illustrate all possible routing avenues that are available over a particular set of standard cells. However, the avenues are not yet metalized and no pin placements are determined. First, a plater determines an order of routing possibilities based on the underlying set of standard cells. Then a router, using a routing algorithm, determines an actual route for the signals and pin placement and pairings. After this is complete, map 600 becomes grid 600 by producing the determined metal paths and pins.

Additionally, or alternatively, it is to be appreciated that the density of gridding is much denser than shown in the figures throughout this description. For example, there can be three rows of wires by eight columns of wires in the space shown in FIG. 6 with only a 3 by 3 arrangement of wires. Even more density may also be provided, based on a specific application. Thus, throughout, the density of the gridding is only shown for ease of description, but the denseness may vary by application Grid 600 comprises "intersecting" wires or metal portions 664 formed as an X-Y grid. Using the wires or metal portions 664, grid 600 can allow for signal propagation in both X and Y directions. Each wire or metal portion 664 is desired to have a minimum diameter and spacing between wires is optimized to allow for maximum and optimal signal routability. The minimum diameter of each wire and spacing between wires can be based on feature sizes of a standard cell, such that as feature sizes continue to decrease, so can the diameter and spacing.

It is to be appreciated, as discussed in more detail below with respect to FIG. 8, grid 600 may actually be a three-dimensional structure, instead of the two-dimensional structure shown in FIG. 6. A three dimensional signal distribution grid can have two or more parallel metal layers interconnected through vias or contacts. Thus, "intersections" between X and Y wires can really be "virtual" since the intersections do not physically occur on a same layer or plane, but rather appear to occur when looking from the top or bottom.

In the example shown, grid 600 is configured to be placed over one or more standard cells (not shown, but see FIG. 7) to deliver power/signals to and receive output from devices on each standard cell. For example, each node or pin 670 is configured to allow for input and output of signals depending on what device or devices, e.g., input or output, of the standard cell are located proximate a corresponding node or pin 670.

Thus, in this example, standard cells are "gridded" in both horizontal and vertical directions. The consequence of cell gridding is that input/output pins 670 are placed at grid intersections, and a size of each standard cell is ideally a multiple of the grid unit both in the x and y direction. The gridding can allow for more efficient routing of signals over the standard cells. However, the gridding can add unwanted constraints to a design of a standard cell. These constraints can lead to both an increase in standard cell area, discussed below with respect to FIG. 7, and an increase in complexity of standard cell implementation.

In general, a y direction gridding constraint can be less of a problem than an x direction gridding constraint because transistors are aligned vertically. Thus, in the y direction there is no predetermined height for standard cells. Instead, the height of each standard cell is determined by its application. As such, the gridding in the y or vertical direction may not result in unnecessary area. On the other hand, horizontally oriented transistors may result in constraints in an x direction that are much harder to meet. For example, the x-direction gridding of standard cells can be based on a minimum metal pitch (metal width plus metal space) available for routing. This value can be technology dependent, e.g., in 65 nm devices a minimum metal pitch is about 0.20 µm, while in 40 nm devices the minimum metal pitch is about 0.14 µm. However, the pitch at which transistors could be placed closest to each other is different, in general, from the minimum metal pitch. For example, in 40 nm devices a transistor pitch is about 0.18 µm. Further, internal wiring and pin placement of a grid can impose extra constraints on the standard cell design.

One result of these constraints is that a width of a standard cell, i.e., an x dimension of a standard cell, may not always be a multiple of each cell grid. When the standard cell is not as wide as a cell grid, a width (and area) of a standard cell can be adjusted through extensions until the standard cell is wide enough to reach a closest grid intersection point. On average, through adding extensions to increase the width of standard cells, an area of each standard cell is increased about half a pitch (i.e., grid point). For a typical circuit design, the average standard cell width is about 10 grid points. Thus, the extensions result in about 5% wasted material (0.50 pitch/10 grid points) on average for a typical design. Given the complexity of fabrication imposed design rules, the added 5% material cannot be simply added to one side of the standard cell, but the additional material usually is spread throughout the standard cell. Also, increasing width and area can increase internal capacitance (both transistor source/drain and internal wire capacitance), which increases dynamic power and delay. Furthermore, extending width can cause the transistors to be spaced apart slightly more than desired, which can result in an increase in leakage because of a polysilicon stress effect.

An increased capacitance effect can also result from pins being placed on exact grid intersections because pins may be moved from a typical position to a grid intersection. For example, as seen in FIGS. 3 and 6, a pin A can be placed over contact along an A polysilicon strip 334A, a pin B can be placed over a contact along a B polysilicon strip 334B, and a pin Out can be placed over a contact at an output portion 341 of a standard cell device 326.

FIG. 7 shows a signal distribution grid (e.g., grid 600) overlapping several standard cells 712-1 to 712-4. Only four standard cells 712 are shown for convenience, as it can be appreciate more or less could also be included. In this example, each standard cell 712-1 to 712-4 has a substantially same height, h, or y value, while having variable widths, $w_1$ to $w_4$, or x values. As shown, not all standard cells 712 fall under a node or pin 670 of grid 600. Thus, in order to provide signals and receive an output, adjustments need to be made to one or more of the standard cells 712-1 to 712-4. In one example, adjustments can be made through adding various sized extensions 780 having respective widths $w_{e1}$, $w_{e2}$, and $w_{e4}$. Extensions 780 can be used to extend standard cells 712-1, 712-2, and 712-4 in the x direction so that they reach a y grid line and a pin 670. For ease of viewing, extensions 780 are shown as shaded portions. It is to be appreciated that extensions 780 may be made from same or different materials as standard cell 712. However, as discussed above, each extension 780 becomes unnecessary additional material, which unnecessarily increases an area of a standard cell 712. For example, the extensions add about 30% more area to standard cell 712-1, about 20% more area to standard cell 712-2, and about 50% more area to standard cell 712-4.

Therefore, what is needed is an elimination of constraints of horizontal gridding for standard cells, i.e., the elimination of unnecessary extensions of standard cells, without sacrificing any of the benefits of cell gridding. In one example, an area of each standard cell can be reduced by about 5% on average, which can also allow for easier cell design. Also, for example, when normal manufacturing costs are hundreds of millions of dollars yearly, an about 5% reduction in silicon chip area could translate into millions of dollars of yearly savings.

In an embodiment of the present invention there is provided a system comprising first and second arrays, first and second plates, a via or contact, and a pin. The first array of conducting devices is arranged in a first direction. The second array of conducting devices is arranged in a second direction, the second direction being substantially perpendicular to the first direction. The first plate is coupled to a first one of the conducting devices in the first array. The second plate is coupled to a first one of the conducting devices in the second array. The vias or contact is coupled between the first and second plates. The pin is coupled to the first one of the conducting devices in the first array and to the first plate. The pin is configured to route input or output signals being sent to or received from a standard cell.

In another embodiment of the present invention there is provided a signal routing grid comprising first and second metal layers, vias or contacts, and pins. The first metal layer has wires running in a first direction. The second metal layer is spaced from and substantially parallel to the first metal layer, and has wires running in a second direction opposite to the first direction. The wires of the first and second metal layers appear from above or below to form virtual intersections. The vias or contacts are coupled between the first and second metal layers and are configured to route signals between the first and second metal layers. The pins are coupled to the first metal layer and configured to provide input signals or receive output signals from a standard cell. The pins are positioned along the wires in the first metal layer so as to be spaced from the virtual intersections.

In a further embodiment of the present invention there is provided a method comprising the following steps (not necessarily in the order discussed). A first array of conducting devices is arranged in a first direction. A second array of conducting devices is arranged in a second direction, the second direction being substantially perpendicular to the first direction. A first plate is coupled to a first one of the conducting devices in the first array. A second plate is coupled to a first one of the conducting devices in the second array. A via or contact is coupled between the first and second plates. A pin is coupled to the first one of the conducting devices in the first array and to the first plate, the pin routes input or output signals being sent to or received from a standard cell.

In a still further embodiment of the present invention there is provided a method comprising the following steps (not necessarily in the order discussed). Wires of a first metal layer run in a first direction. Wires of a second metal layer run in a second direction different than the first direction, such that the wires of the first and second metal layers appear from above or below to form virtual intersections. The second metal layer is spaced from and substantially parallel to the first metal layer. Vias are coupled between the first and second metal layers to route signals between the first and second metal layers. Pins are coupled to the first metal layer to provide input signals or receive output signals from a standard cell, the pins being positioned along the wires in the first metal layer so as to be spaced from the virtual intersections.

Figure 8:
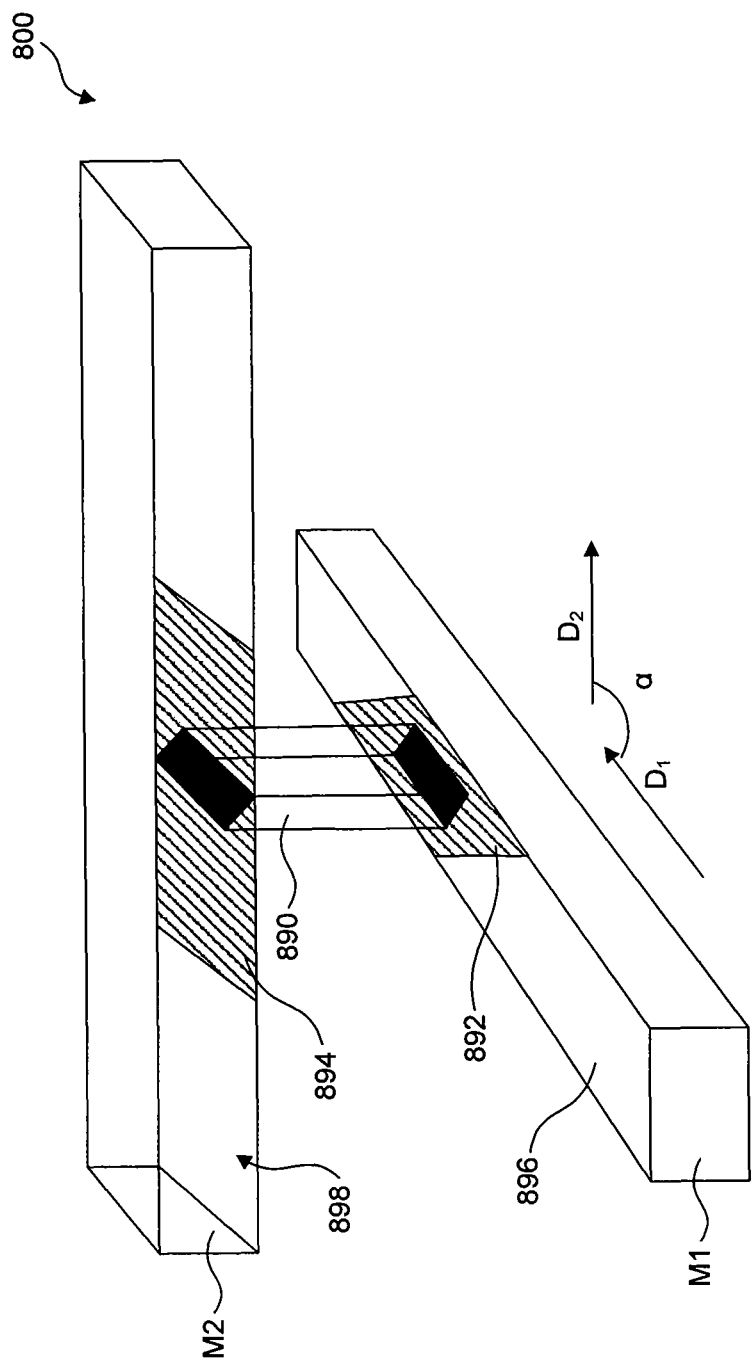
FIG. 8 shows a portion of a three-dimensional signal distribution grid, according to an embodiment of the present invention.

FIG. 8 shows a portion 800 of a signal distribution grid, according to an embodiment of the present invention. Grid portion 800 in FIG. 8 shows an example of a portion of a three-dimensional multiple layer arrangement. In this example, a first metal or routing layer Metal1 or M1 (hereinafter metal and routing layers are used interchangeably) runs along a first direction D1 and a second metal layer Metal2 or M2 runs along a second direction D2. In the example shown, the second direction D2 is at an angle α with respect to the first direction D1. For example, the first and second directions D1 and D2 can be substantially perpendicular, e.g., α≈90°. To route signals between layers M1 and M2, a via or contact 890 is connected or coupled between M1 and M2. In one example, each end of via or contact 890 is coupled to elongated metal plates 892 and 894 (shown as shaded rectangles), which metal plates 892 and 894 are coupled to respective surfaces 896 and 898 of metal layers M1 and M2. Although via 890 is shown in cross section as a rectangular, via 890 can have a square cross section, or other shapes.

In one example, metal plates 892 and 894 have a predetermined minimum area, with variable width and length, which may be with respect to a diameter of a wire (e.g., wire 664 of map 600). For example, having a minimum width of plates 892/894 guarantees that the lengths of the plates traverse one or more grid intersection ports. is chosen so that a length of plates 892/894 traverses one or more grid intersection points. As will be discussed in more detail below, the use of plates 892/894 allows for placement of pins (e.g., pins 970 in FIG. 9)

to be anywhere along an x-axis, and away from only being at grid intersections. Also, the smaller the width of plates 892/894, the less chance of two plates on parallel X-axis wires encroaching or touching each other. For example, a desired width of a plate may be 0.07 μm, which results in a length of the plate of 0.36 μm. Thus, with a normal grid pitch of 0.14 μm at least two grid intersection points will always be within a length of a respective one of the plates 892/894.

In operation, signals can be routed in the direction D1 (e.g., X) and the direction D2 (e.g., Y) along grid portion 800 through routing signals along and between the first and second metal layers M1 and M2.

It is to be appreciated, complex signal routing of a large number of signals may be desired based on a given application. Complex routing can be accomplished by using five or more metal layers. For example, grid portion 800 can perform complex signal routing using a five metal layer arrangement, i.e., an additional third metal layer Metal3 or M3, fourth metal layer Metal4 or M4, and fifth metal layer Metal5 or M5 could be added to grid portion 800. In this example, each subsequent metal layer can be oriented substantially perpendicular to its adjacent one or two other metal layers. For example, M1 is substantially perpendicular to M2, M2 is substantially perpendicular to M3, and so on.

Figure 9:
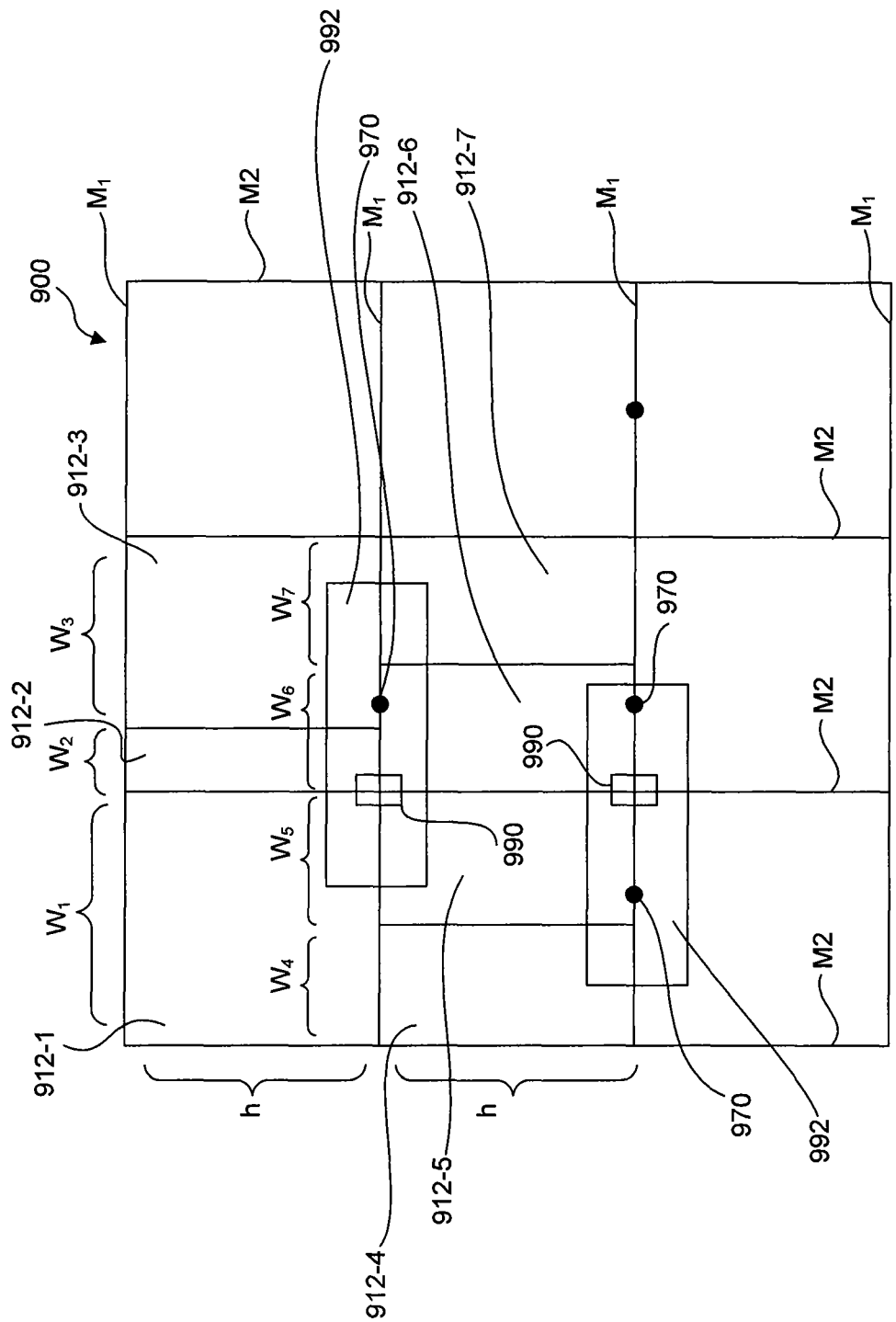
FIG. 9 shows a signal distribution grid overlapping one or more standard cells, according to an embodiment of the present invention.

FIG. 9 shows a signal distribution grid 900 overlapping one or more standard cells 912-1 to 912-7, according to an embodiment of the present invention. It is to be appreciated only standard cells 912-1 to 912-7 are shown for convenience, while more or less standard cells 912 may be used.

In one example, grid 900 can include a three-dimensional arrangement including x direction metal layer M1 and y direction metal layer M2 (although they appear as two dimensional, they could be spaced apart and coupled via a via or contact, i.e., three dimensional as shown in FIG. 8). Elongated metal plates 992 of metal layer M1 are shown, while metal plates for metal layer M2 are not shown, for convenience. A phantom view of via or contact 990 is shown around each virtual intersection point.

In the embodiment shown in FIG. 9, grid 900 has pins 970 located along a metal layer M1, but located in-between virtual intersections points where metal layer M1 would virtually cross metal layer M2. The arrangement of pins 970 in this embodiment is different from grid 600 in FIG. 6, which had pins 670 at intersections of X and Y gridlines. Also, FIG. 9 is different from grid 600 in FIGS. 6 and 7 because of the use of metal plates 992 that are coupled to pins 970 and extend along metal layer M1.

In this example, each standard cell 912 has a substantially same height, h, while having variable widths, $w_1$ to $w_7$. However, based on using metal plates 992 along metal layer M1, where plates 992 are coupled to vias 990 and pins 970, no extensions (e.g., extensions 780 in FIG. 7) of standard cells 912 are necessary. Thus, even standard cells 912-2 to 912-7 that are not wide enough to reach a virtual intersection point are still coupled to pins 970 through metal plates 992. Therefore, in this arrangement shown in FIG. 9 (and FIG. 8), a substantial cost and materials savings can be achieved as compared to the arrangement shown in FIG. 7 without a reduction in routability of signals.

In this example, plate 992 can be long enough to fulfill a minimum area rule. In this example, pins 970 are either on metal layer M1 or "brought to" metal layer M1 by via or contact 990. Because the vertical direction is still gridded, no horizontal routing resources are lost. In one example, metal plate 992 can stretch across several x,y-grid points. As such, via or contact 990 can still keep its own gridding on the x direction for a third metal layer metal3 (not shown), a fifth metal layer metal5 (not shown), etc., thus not altering the vertical routability. Thus, through use of via or contact 990 coupled to plate 992, a standard cell 912 does not need to be gridded in a horizontal direction for via or contact 990 to continue to be coupled to the standard cell 912 to keep standard cell 912 functionally fully gridded in both directions. This way, a standard cell 912 can have a reduced overall area (e.g., no extensions), but still maintain maximized routing resources.

Typically, development of a new chip involves: design of standard cells, a determination of which standard cells require extensions to meet a grid pitch, and redesign of standard cells that require extensions. However, through the grid arrangement shown in FIGS. 8 and 9, the last two steps may no longer be necessary, which makes design and implementation faster and less complex. Further, design constraints are also lessened without effecting routability.

FIGS. 10-12 show various configurations of relationships between extension regions 1080/1180/1280 of standard cells (not shown) in adjacent rows 1062/1162/1262. In one example, traditionally foundries have imposed rules regarding overlapping of threshold voltage (Vt) implants or extension regions 1080/1180/1280. As can be understood, depending on random arrangement of standard cells in different rows 1062/1162/1262, extensions 1080/1180/1280 of standard cells in one row 1062/1162/1262 may be directly overlapping cells in another row 1062/1162/1262 (FIG. 12), touching (FIG. 11), or spaced from (FIG. 10) extensions 1080/1180/1280 of standard cells in adjacent rows 1062/1162/1262. Previously, foundries have limited these configurations, for example by imposing that all spacing between standard cells, through adding extension regions, be one grid pitch in size. However, through the embodiments shown in FIGS. 8 and 9, these constraints on relationships between extension regions in adjacent rows have been substantially eliminated since no extensions are utilized. Thus, standard cell design has greater freedom and fewer constraints.

Figure 13:
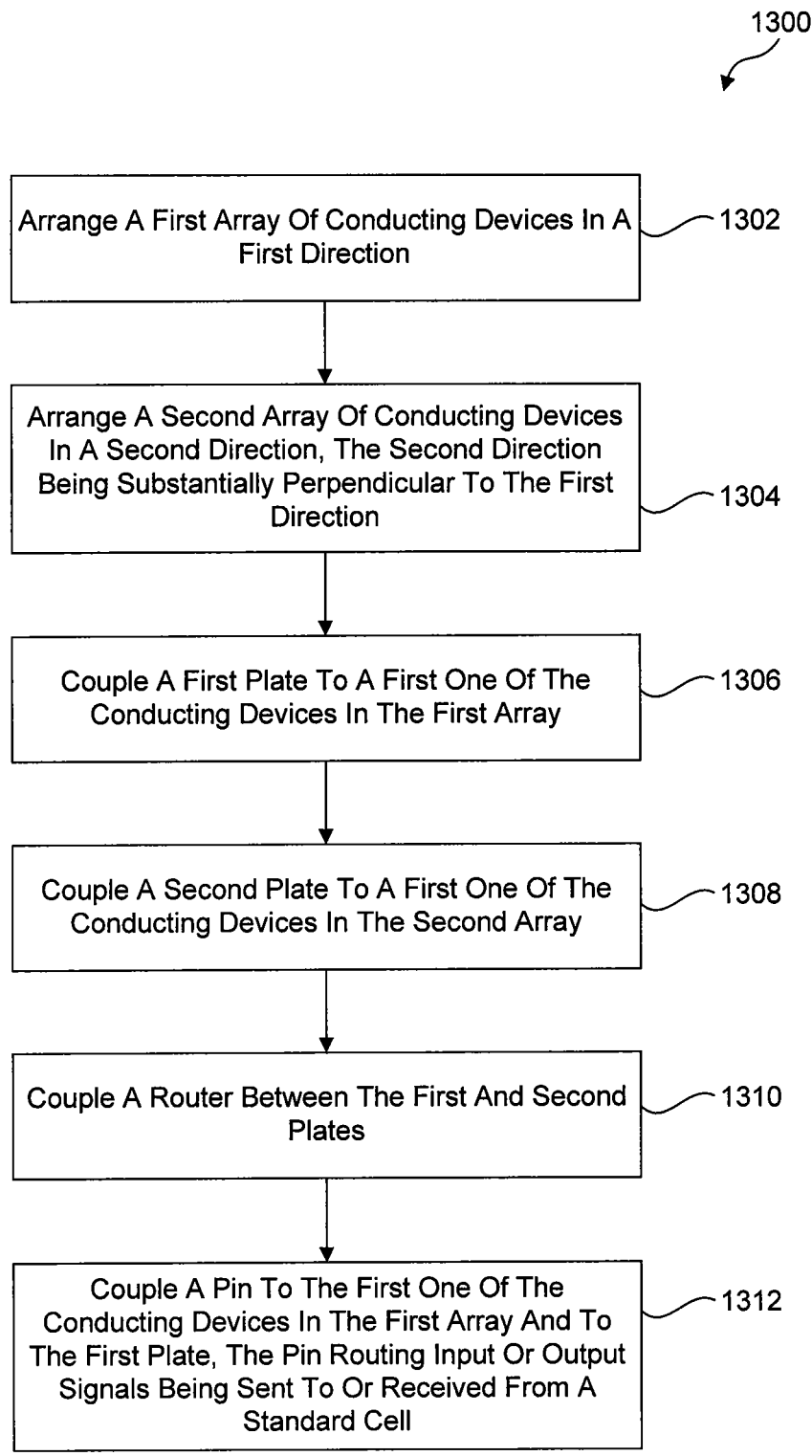
FIGS. 13-14 show flowcharts depicting methods, according to various embodiments of the present invention.

FIG. 13 shows a flowchart depicting a method 1300, according to an embodiment of the present invention. It is to be appreciated the method may proceed in a different sequence that that described. In step 1302, a first array of conducting devices is arranged in a first direction. In step 1304, a second array of conducting devices is arranged in a second direction, the second direction being substantially perpendicular to the first direction. In step 1306, a first plate is coupled to a first one of the conducting devices in the first array. In step 1308, a second plate is coupled to a first one of the conducting devices in the second array. In step 1310, a via or contact is coupled between the first and second plates. In step 1312, a pin is coupled to the first one of the conducting devices in the first array and to the first plate, such that the pin provides an input or output point for signals being sent to or received from a standard cell.

Figure 14:
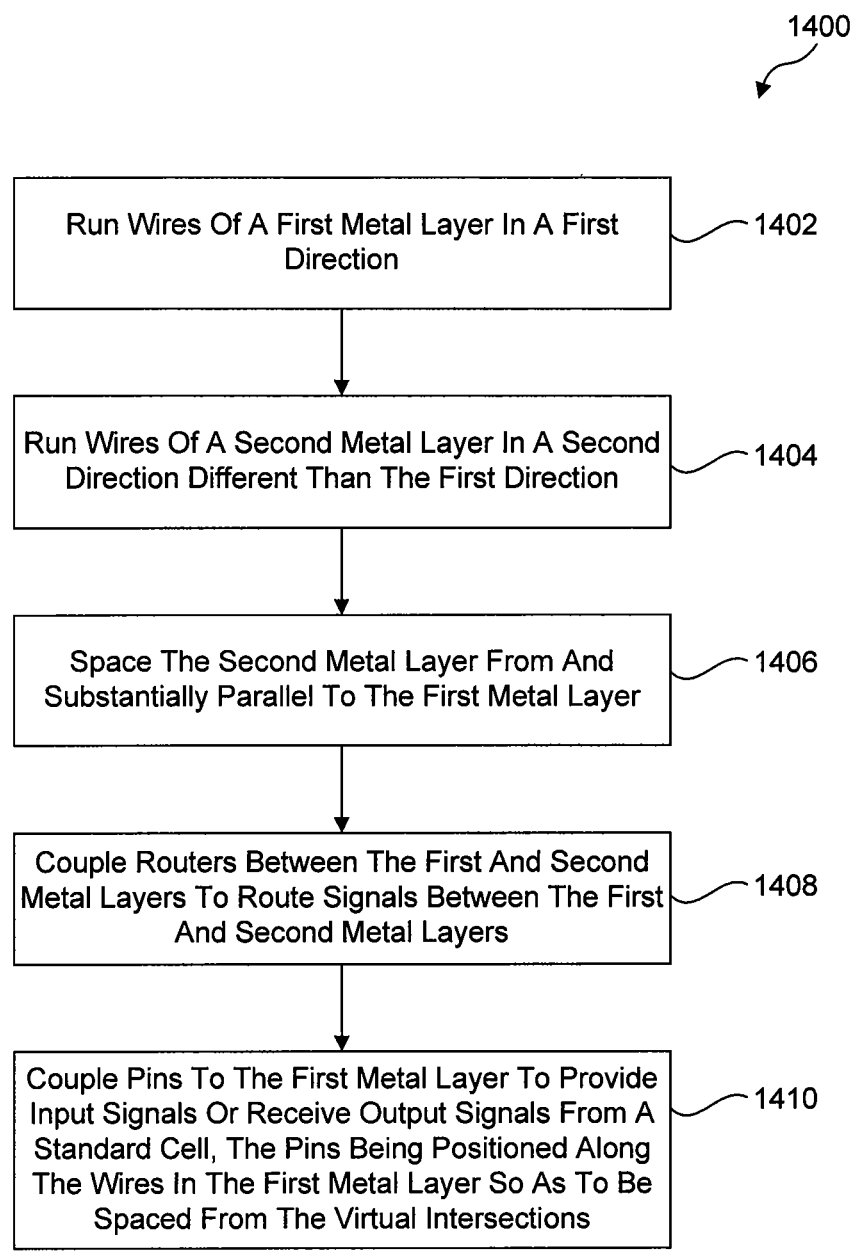

FIG. 14 shows a flowchart depicting a method 1400, according to an embodiment of the present invention. It is to be appreciated the method may proceed in a different sequence that that described. In step 1402, wires of a first metal layer are run in a first direction. In step 1404, wires of a second metal layer are run in a second direction different than the first direction, such that the wires of the first and second metal layers appear from above or below to form virtual intersections. In step 1406, the second metal layer is spaced from and substantially parallel to the first metal layer. In step 1408, vias or contacts are coupled between the first and second metal layers to route signals between the first and second metal layers. In step 1410, pins are coupled to the first metal layer to provide input signals or receive output signals from a standard cell, the pins being positioned along the wires in the first metal layer so as to be spaced from the virtual intersections.

CONCLUSION

It is to be appreciated that the Detailed Description section, and not the Abstract section, is intended to be used to interpret the claims. The Abstract section may set forth one or more, but not all, exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A semiconductor device configured with a standard cell comprising:
   a first array of substantially parallel conducting devices arranged in a first direction;
   a second array of substantially parallel conducting devices arranged in a second direction, the second direction being substantially perpendicular to the first direction;
   a first plate having a surface and coupled to a first one of the conducting devices in the first array;
   a second plate having a surface facing the surface of the first plate and coupled to a first one of the conducting devices in the second array;
   a via or contact connected to the surfaces of the first and second plates, wherein the via or contact is located below the first array and above the second array; and
   a pin coupled to the first one of the conducting devices in the first array and to the first plate, wherein the pin is spaced from the via.

2. The semiconductor device of claim 1, further comprising:
   a third plate coupled to a second one of the conducting devices in the first array, wherein the first plate and the third plate have a predetermined area, such that widths of the first and third plates are set to ensure a predetermined distance is maintained between the first and third plates.

3. The semiconductor device of claim 1, wherein:
   the first array is within a first plane;
   the second array is within a second plane, the second plane being spaced from and substantially parallel to the first plane.

4. The semiconductor device of claim 1, further comprising:
   wherein the standard cell is one of a plurality of standard cells, each standard cell in the plurality of the standard cells having substantially same height, varying widths, and lacking extensions.

5. The semiconductor device of claim 1, further comprising:
   a plurality of additional arrays of substantially parallel conducting devices, wherein:
      the plurality of additional arrays is arranged in the second direction in response to the plurality of additional arrays being adjacent to the first array of conducting devices; and
      the plurality of additional arrays is arranged in the first direction in response to the plurality of additional arrays being adjacent to the second array of conducting devices.

6. The semiconductor device of claim 1, wherein:
   the pin is located along the first one of the conducting devices in the first array, such that the pin is not proximate to a virtual intersection that forms in response to the first and second arrays being viewed from above or below.

7. The semiconductor device of claim 1, wherein the pin is configured to route input or output signals sent to or received from the standard cell.

8. A signal routing grid configured with a standard cell comprising:
   a first metal layer having wires running in a first direction;
   a second metal layer, spaced from and substantially parallel to the first metal layer, having wires running in a second direction, wherein the second direction is substantially perpendicular to the first direction;
   a via or contact directly connected to one of the wires in the first metal layer and one of the wires in the second metal layer, wherein the via or contact runs from the first metal layer to the second metal layer; and
   a pin coupled to the one of the wires in the first metal layer, wherein the pin is spaced from the via.

9. The signal routing grid of claim 8, further comprising:
   a first plate coupled to a first one of the wires in the first metal layer;
   a second plate coupled to a first one of the wires in the second metal layer.

10. The signal routing grid of claim 9, wherein the first plate is coupled to the pin.

11. The signal routing grid of claim 9, wherein the via or contact is coupled to the first and second plates.

12. The signal routing grid of claim 8, wherein the wires of the first and second metal layers visually appear from above or below to form virtual intersections.

13. The signal routing grid of claim 8, wherein the pin is configured to route input or output signals sent to or received from the standard cell.

14. The signal routing grid of claim 8, wherein the via or contact is configured to route signals between the first and second metal layers.

15. A method of arranging a semiconductor device having a standard cell comprising:
   arranging a first array of substantially parallel conducting devices in a first direction;

arranging a second array of substantially parallel conducting devices in a second direction, the second direction being substantially perpendicular to the first direction;

coupling a first plate, including a surface, to a first one of the conducting devices in the first array;

coupling a second plate, including a surface facing the surface of the first plate, to a first one of the conducting devices in the second array;

coupling a via or contact to the surfaces of the first and second plates, wherein the via or contact is located below the first array and above the second array; and coupling a pin to the first one of the conducting devices in the first array and to the first plate, wherein the pin is spaced from the via.

16. The method of claim 15, wherein the pin is located along the first one of the conducting devices in the first array, such that the pin is not proximate to a virtual intersection that appears to form in response to the first and second arrays being viewed from above or below.

17. The method of claim 15, wherein the pin is configured to route input or output signals sent to or received from the standard cell.

18. A method of arranging a semiconductor device having a standard cell comprising:

running wires of a first metal layer in a first direction;

running wires of a second metal layer in a second direction, wherein the second direction is substantially perpendicular to the first direction, such that the wires of the first and second metal layers appear from above or below to form virtual intersections;

spacing the second metal layer from and substantially parallel to the first metal layer;

coupling vias or contacts to the wires in the first and second metal layers to route signals between the first and second metal layers, wherein the vias or contacts are located below the first metal layers and above the second metal layers;

coupling pins to the wires in the first metal layer that is coupled to the vias or contacts; and spacing the pins from the vias.

19. The method of claim 18, wherein the pins are positioned along the wires in the first metal layer, such that the pins are not proximate to the virtual intersections.

20. The method of claim 18, wherein the pins are configured to route input or output signals sent to or received from the standard cell.

* * * * *